(12) United States Patent
West (10) Patent No.: US 6,937,006 B2
(45) Date of Patent: Aug. 30, 2005

(54) PIN ELECTRONICS INTERFACE CIRCUIT

(75) Inventor: Burnell G. West, Half Moon Bay, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 10/931,311

(22) Filed: Aug. 31, 2004

(65) Prior Publication Data

US 2005/0024041 A1 Feb. 3, 2005

Related U.S. Application Data (63) Continuation of application No. 10/216,084, filed on Aug. 9, 2002.
(60) Provisional application No. 60/313,135, filed on Aug. 17, 2001.

(51) Int. Cl.$^7$ ............................................... G01R 31/26
(52) U.S. Cl. ................................... 324/158.1; 324/765
(58) Field of Search .............................. 324/765, 760, 324/763, 158.1, 73.1, 761; 714/738

(56) References Cited

U.S. PATENT DOCUMENTS

| | | | |
|---|---|---|---|
| 4,849,702 A | 7/1989 | West et al. | |
| 4,929,888 A | 5/1990 | Yoshida | |
| 5,101,153 A | 3/1992 | Morong, III | |
| 5,212,443 A | 5/1993 | West et al. | |
| 5,225,772 A | 7/1993 | Cheung et al. | |
| 5,266,894 A | * 11/1993 | Takagi et al. | ............... 324/765 |
| 5,461,310 A | 10/1995 | Cheung et al. | |
| 5,477,139 A | 12/1995 | West et al. | |
| 5,712,855 A | 1/1998 | Goto et al. | |
| 5,909,450 A | 6/1999 | Wright | |
| 5,951,705 A | 9/1999 | Arkin et al. | |
| 6,133,725 A | * 10/2000 | Bowhers | ................... 324/158.1 |
| 6,275,023 B1 | 8/2001 | Oosaki et al. | |
| 6,677,775 B2 | * 1/2004 | Babcock | ..................... 324/765 |

* cited by examiner

Primary Examiner—Vinh Nguyen
Assistant Examiner—Tung X. Nguyen
(74) Attorney, Agent, or Firm—Fish & Richardson P.C.

(57) ABSTRACT

A pin electronics circuit for use in automatic test equipment may include a reconfigurable logic device in which different logic configurations may be installed to make measurements according to multiple tests to be applied to a device under test; a level generating circuit coupled to the reconfigurable logic device, and configured to generate a number of test levels and a number of reference levels; and a switching circuit, coupled to the reconfigurable logic device and the level generating circuit, configured to receive the test levels and the reference levels, and controlled by the reconfigurable logic device to selectively apply the test levels to the device under test according to a selected test and to sense levels inputted to or outputted from the device under test by comparing the reference levels generated by the level generating circuit to the levels inputted to our outputted from the device under test.

17 Claims, 3 Drawing Sheets

PIN ELECTRONICS INTERFACE CIRCUIT

RELATED APPLICATION

This is a continuation of application Ser. No. 10/216,084, filed Aug. 9, 2002. This application claims priority to U.S. Provisional Patent Application No. 60/313,135, filed Aug. 17, 2001, which is incorporated by reference.

BACKGROUND

This application relates to automatic test equipment (ATE) pin electronics circuits for testing integrated circuit devices. Examples of ATE systems and/or components thereof are set forth in the following U.S. patents, all of which are incorporated by reference: U.S. Pat. No. 5,673,275, U.S. Pat. No. 5,225,772, and U.S. Pat. No. 5,212,443.

In ATE used to test integrated circuit devices, pin electronics circuits are coupled to the pins or other nodes of an integrated circuit device being tested, typically referred to as the "device under test" or DUT. Through the pins, stimuli signals or waveforms are supplied to the DUT, and output signals or waveforms from the DUT are detected and measured. Typically, the stimuli signals or waveforms represent logic states or analog voltages or currents, which generally are applied to the pins of the DUT in parallel, with the resulting output signals read in parallel.

Many different types of electrical tests can be applied to DUT pins. Different kinds of pin electronics circuits typically are used to apply these different types of tests. Examples of tests that may be applied to DUT pins include the following:

Digital Test—this test typically includes a sequence of test vectors, described according to industry standard definitions such as the Standard Tester Interchange Language (STIL) defined in Institute of Electrical and Electronics Engineers (IEEE) specification 1450, in which a DUT's input pins are driven to HIGH or LOW logic levels according to the contents of the vector, and the DUT's output pins are measured to determine whether the output voltage is above or below a specified logic threshold level. This test is executed at a time appropriately defined for each vector in the sequence.

Continuity Test—this test determines whether an electrical connection exists between the pin electronics circuit and a DUT input, output, or input/output ("I/O") pin.

Voltage Output High (VOH) Test—this test measures the HIGH logic level output voltage when a specified current is applied to a DUT output pin.

Voltage Output Low (VOL) Test—this test measures the LOW logic level output voltage when a specified current is applied to a DUT output pin.

Input Current High (IIH) Test—this test measures the current required to drive a DUT input pin to a specified HIGH logic level. This test may be referred to as a "leakage test."

Input Current Low (IIL) Test—this test measures the current required to drive a DUT input pin to a specified LOW logic level. Like IIH tests, this test also may be referred to as a "leakage test."

Continuity tests, voltage tests, and current tests, such as those discussed above, typically are made using a Parametric Measurement Unit (PMU) in conjunction with pin electronics circuits. The PMU is an instrument that can force voltage and measure current, and/or force current and measure voltage. Characteristics of a PMU include resolution, range, performance, and programmable limits. Resolution refers to the ability to generate or measure small differences in voltage or current. Range refers to the highest and lowest voltages or currents that the PMU can generate or measure. Performance refers to the number of measurements of all types that can be made per unit of time. Programmable limits refer to the ability to set limitations on the current or voltage range so that devices being tested are not damaged by the PMU.

Conventional pin electronics circuits typically have individual circuits separately available to conduct tests, such as those described above. Such conventional pin electronics circuits generally include a driver circuit that generates preprogrammed logic levels, one or more comparator circuits to measure output levels, a preprogrammed load circuit that forces a voltage-dependent current to be drawn from or pushed into the DUT pin, and a PMU, which can be programmed to apply a specific current and measure the resulting voltage or alternatively to apply a specific voltage and measure the resulting current.

SUMMARY

The present inventor recognized that conventional pin electronics circuits tend to be expensive, relatively inflexible, and/or time-consuming and costly in operation. For example, some conventional ATE systems use pin electronics circuits that have individual circuits separately available to conduct a variety of tests. In such systems, the different tests typically are applied as separate test steps because all of the available testing circuits typically can not be connected to the DUT pin at the same time. As a result, such pin electronics circuits frequently include relays or switches to switch different subsets of testing circuits off and others on. Such relay switching typically takes time and therefore the tests tend to be more time-consuming and costly.

Consequently, the present inventor developed a flexible and generalized pin electronics circuit architecture that integrates the functions of the individual circuits of conventional pin electronics circuits. Among other features of this architecture, several different tests (for example, any or all of the tests discussed above) can be implemented without extra connection or disconnection means, while also reducing testing time and expense. The flexible and generalized pin electronics circuit may include a level generating circuit (e.g., one or more digital to analog converters (DAC)), which can be used to generate drive and compare levels; one or more operational amplifiers, which can be used to buffer and drive the DUT pin; a switching circuit, such as one or more complementary metal oxide semiconducting (CMOS) switches and a non-linear network (e.g., one or more diodes and resistors), which can be used to selectively apply signals to the DUT pin; and one or more comparators, which may be included in the switching circuit and can be used to establish the levels of current and voltage that are applied to the DUT pin or generated by the DUT pin. The flexible and generalized pin electronics circuit also may include a reconfigurable logic device, in which a particular logic configuration can be installed to make any of the measurements under control of a test controller responsive to an industry standard test description.

Implementations of the flexible and generalized pin electronics circuit described here may include various combinations of the following features.

In one aspect, a flexible and generalized pin electronics circuit, for example, to be used with ATE for testing an integrated circuit device, may include: a reconfigurable logic device, such as a field programmable gate array (FPGA), in which different logic configurations may be installed to make measurements according to a plurality of tests to be applied to a DUT; a level generating circuit, which may include one or more DACs, coupled with the reconfigurable logic device and configurable to generate one or more test levels (e.g., VHI, VTERM, VLO) to be applied to the DUT and/or one or more reference levels (e.g., CREF and DREF) to be used in sensing the level inputted to or outputted from the DUT in accordance with a test being performed; and a switching circuit, which may include complementary metal oxide semiconductor (CMOS) switches or other suitable switches or relays known to one of ordinary skill, controlled by the reconfigurable logic device and arranged to selectively apply a level generated by the level generating circuit (e.g., VHI, VTERM, VLO) to the DUT in accordance with a test being performed. The flexible and generalized pin electronics circuit also may include sensing circuitry, such as comparators, configurable to compare input and/or output levels of the DUT to the reference levels (e.g., CREF or DREF) generated by the level generating circuit in response to a test being performed.

The reconfigurable logic device may include a digital test sequencer and a parametric measurement unit (PMU) sequencer. The digital test sequencer may have a plurality of outputs and an input, each output being configurable to output a test vector and the input being configurable to receive a signal corresponding to results of a test. The PMU sequencer may be configured and operable to communicate with the switching circuit and level generating circuit to set the various levels in accordance with the tests to be applied.

The switching circuit also may include a number of operational amplifiers, each coupled between the reconfigurable logic device and a corresponding switch. The operational amplifiers are capable of driving the switches to relay a particular test signal (e.g., VHI, VLO, or VTERM). A buffer also may be included in the switching circuit, which may be coupled between the switches and the DUT. The buffer, which may be an operational amplifier arranged as a buffer, drives the relayed test level to the DUT. A non-linear network (e.g., one or more diodes and resistors) may be coupled between the buffer and the device under test. Such a non-linear network may simplify low current measurements of the DUT. A non-linear network excluding diodes also may be used. Such a non-linear network may simplify the process of calibrating the ATE.

In another implementation, configuring a test system to test an integrated circuit device includes providing a test system having a programmable pin electronics circuit, such as the pin electronics circuit discussed above; configuring the test system to be in communication with a DUT; and programming the pin electronics circuit to implement a selected test from a plurality of tests. Providing a test system having a programmable pin electronics circuit may be accomplished, for example, by providing a test system having a plurality of digital test sequencers, a parametric measurement unit, a level generating circuit and a plurality of switching circuits.

Programming the pin electronics circuit to implement a selected test from a plurality of tests may be accomplished, for example, by setting values for a plurality of test levels and a plurality of reference levels, generating the plurality of test levels and the plurality of reference levels at the set values, applying selectively the generated plurality of test levels to the DUT, sensing levels inputted to or outputted from the DUT in response to the selected test, comparing the sensed levels inputted to or outputted from the DUT to the reference levels, and outputting a signal corresponding to results of the selected test to a display device.

The flexible and generalized pin electronics circuit and techniques described here may provide several advantages. For example, because the overall cost of ATE may depend to a significant degree on a relatively small number of custom components, conventional pin electronics circuits requiring individual circuits relayed together to perform various tests tend to have relatively expensive manufacturing, configuration and operating costs. Furthermore, performing various tests (such as those described above) using conventional pin electronics circuits tends to be time consuming and therefore costly due to relay switching between individual circuits within the conventional pin electronics circuit. In contrast, because the flexible and generalized pin electronics circuit is based on a generalized architecture, the costs associated with manufacturing the flexible pin electronics circuit are less and the time required to perform a variety of tests tends to decrease. As a result, the design, development and other associated overhead costs may be reduced dramatically.

Details of one or more embodiments are set forth in the accompanying drawings and the description below. Other features and advantages will be apparent from the description and drawings.

DESCRIPTION OF DRAWINGS

Like reference symbols in the various drawings indicate like elements.

DETAILED DESCRIPTION

Figure 1:
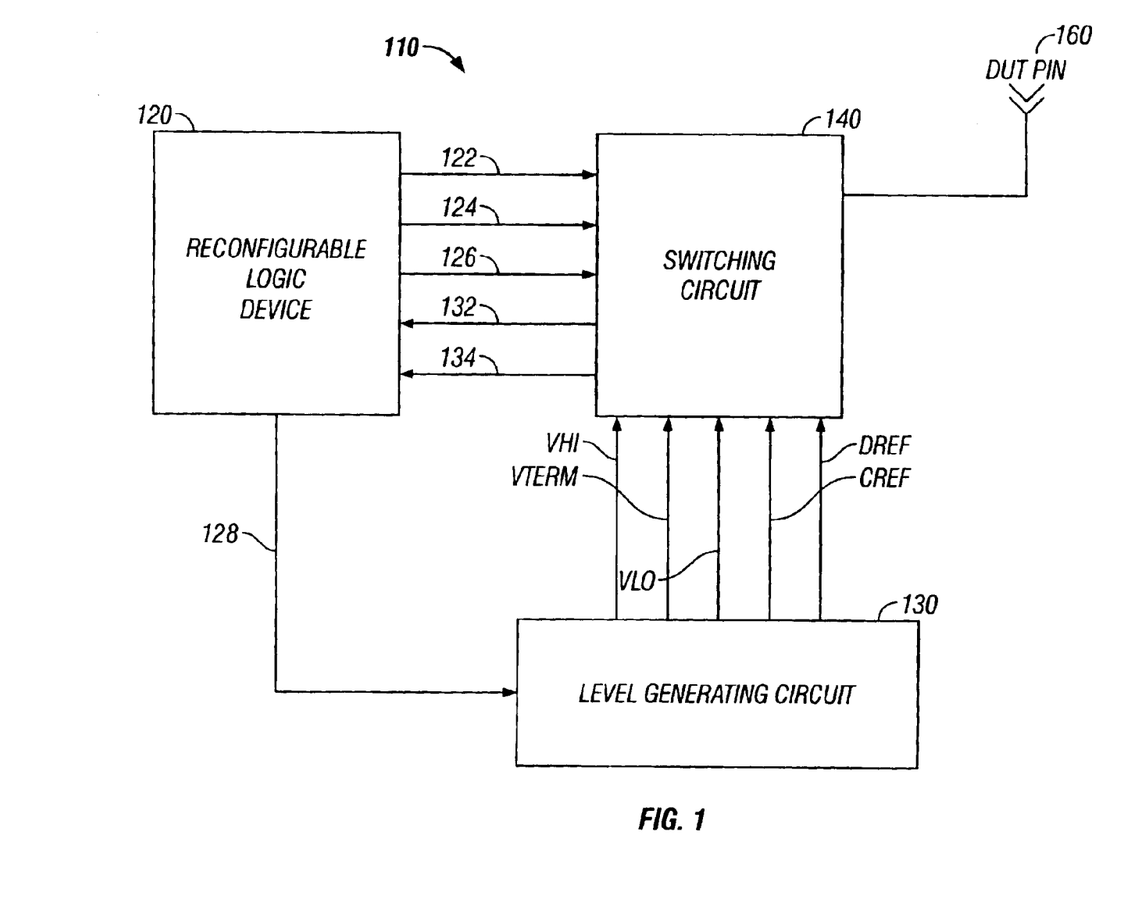
FIG. 1 is a diagram of a flexible and generalized pin electronics circuit.

FIG. 1 is a diagram of a flexible and generalized pin electronics circuit 110 that is selectively programmable to perform a variety of tests, such as those described above, on a DUT pin 160. The pin electronics circuit 110 includes a reconfigurable logic device 120, a level generating circuit 130, and a switching circuit 140.

The level generating circuit 130, which may include a plurality of DACs, is configurable to generate one or more test levels, identified as voltage high drive level (VHI), voltage low drive level (VLO), and termination voltage (VTERM), to be applied to the DUT pin 160 through switching circuit 140 in accordance with a test being performed. In addition, the level generating circuit 130 is configurable to generate reference levels, identified as compare reference (CREF), and drive reference (DREF), to be used by the reconfigurable logic device 120 in measuring the output of DUT pin 160 through the switching circuit 140 in accordance with a test being performed.

The reconfigurable logic device 120 may be a field programmable gate array (FPGA), such that different logic configurations can be installed to perform a plurality of functions, such as: setting the various test and/or reference levels to be generated and applied by the level generating circuit 130 to the DUT pin 160 through the switching circuit 140; outputting test vectors (also referred to as control signals) to control the switching of the switching circuit 140; and/or receiving and measuring compare signals 132, 134 outputted from the switching circuit 140. The reconfigurable logic device 120 can be coupled to the level generating circuit 130 via line 128 to provide appropriate control data to the level generating circuit 130 to set the values of the various test and/or reference levels. The reconfigurable logic device 120 is selectively programmable to output test vectors on lines 122, 124 and 126 to the switching circuit 140, which may include a plurality of switches, e.g., complementary metal oxide semiconducting (CMOS) switches, and associated circuitry. The test vectors provided through lines 122, 124 and 126 drive the plurality of switches in the switching circuit 140 either ON or OFF. The switching circuit is arranged so that the reconfigurable logic device 120 may selectively allow the test levels VHI, VTERM or VLO, which are generated by the level generating circuit 130, to be applied to the DUT pin 160 in accordance with a test being performed. The reconfigurable logic device 120 is configurable to receive and measure compare signals 132, 134 outputted from the switching circuit 140. The compare signal 132 results from a comparison of the reference level DREF with the signal that is inputted to the DUT pin 160, while the compare signal 134 results from a comparison of the reference level CREF with the signal that is outputted from the DUT pin 160.

Typically, a separate pin electronics circuit 110 would be provided for, and connected to, each pin of the DUT.

Figure 2:
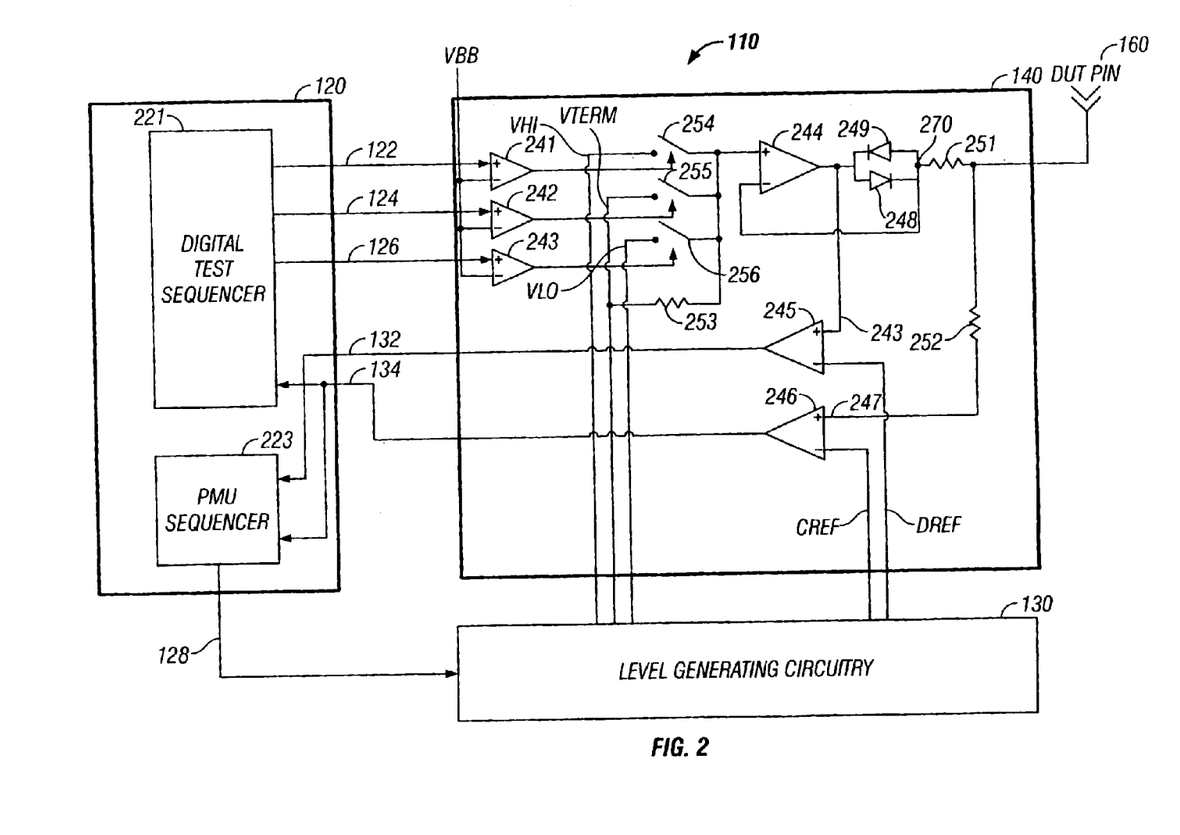
FIG. 2 is a detailed diagram of FIG. 1.

FIG. 2 is a more detailed diagram of the pin electronics circuit 110. The reconfigurable logic device 120 may be implemented as an FPGA, which can be configurable to perform the functions of a Digital Test Sequencer 221 and a PMU Sequencer 223. Details of a suitable Digital Test Sequencer 221 may be found in U.S. Pat. No. 5,212,443, entitled "Event Sequencer for Automatic Test Equipment," which is incorporated by reference. The operation of the PMU Sequencer 223 is discussed below.

The Digital Test Sequencer 221 is programmably selectable to output test vectors to and receive compare signals from the switching circuit 140. The PMU sequencer 223 is programmably selectable to set various test and/or reference levels to be generated and applied by the level generating circuit 130 to the DUT pin 160 through the switching circuit 140. The level generating circuit 130 may include a group of five DACs 236, although a greater or lesser number of DACs could be used depending on design parameters and constraints. The group of five DACs 236 generate and apply test levels VHI, VLO and VTERM and reference levels CREF and DREF to the switching circuit 140. The switching circuit 140 may include four operational amplifiers 241, 242, 243, 244; two comparators 245, 246; two diodes 248, 249; three resistors 251, 252, 253; and three CMOS switches 254, 255, 256.

The pin electronics circuit 110 operates as follows. The Digital Test Sequencer 221 is selectively programmable to provide test vectors on lines 122, 124, 126, 126 to the positive input terminal of the operational amplifiers 241, 242, 243. The negative input terminal of the operational amplifiers 241, 242, 243 is connected to a voltage VBB, which is an intermediate voltage level between the HIGH and LOW output voltage levels of the Digital Test Sequencer 221. The test vectors act as control signals, which drive the operational amplifiers 241, 242, 243 to a HIGH voltage level, which is set by the operational amplifiers' positive power supply, or to a LOW voltage level, which is set by the operational amplifiers' negative power supply.

Operational amplifiers 241, 242, 243 typically are used as buffers, which drive the CMOS switch 254, 255, 256 either ON or OFF. The output voltage level of each operational amplifier 241, 242, 243 is coupled to the control terminal of a corresponding CMOS switch 254, 255, 256, respectively, which is turned ON or OFF based on the output voltage level of the operational amplifier 241, 242, 243. For example, if the output voltage level of any operational amplifier 241, 242, 243 is at a HIGH logic voltage level, then the corresponding CMOS switch 254, 255, 256 is turned ON (also referred to as closed). Likewise, if the output voltage level of any operational amplifier 241, 242, 243 is at a LOW logic voltage level, then the corresponding CMOS switch 254, 255, 256 is turned OFF (also referred to as opened).

The positive and negative power supplies of the operational amplifiers 241, 242, 243 are selected to assure that the operating range of the CMOS switches 254, 255, 256 exceeds the normal programming range of the test levels VHI, VTERM, and VLO. This assures that the output voltage levels of the operational amplifiers 241, 242, 243 properly operate the CMOS switches 254, 255, 256. In this particular implementation, BurrBrown OP4132 operational amplifiers are used, although other types of operational amplifiers known to those of ordinary skill can be used.

In normal operation of the pin electronics circuit 110, only one of the CMOS switches 244, 245, 246 is closed at any given time. Therefore the signal that is applied to the positive input terminal of the operational amplifier 244 is typically one of the test levels VHI, VTERM or VLO. If none of the CMOS switches 254, 255, 256 are closed, or if two or more are closed, then the pin electronics circuit 110 is not operating normally. However, in the process of closing one CMOS switch 254, 255, 256 and opening another, for a short period of time it may happen that neither switch is closed or that both switches are closed. If no CMOS switch 254, 255, 256 is closed, then the test level VTERM's voltage is connected to the positive input terminal of the operational amplifier 244 through the resistor 253, which may be a very high value resistor. Consequently, the voltage that is applied on the positive input terminal of the operational amplifier 244 will tend to drift slowly toward VTERM based on the time constant of the value of the resistor 253 multiplied by the stray capacitance at the positive input terminal of the operational amplifier 244. If two or more switches are closed, then the voltage on the positive input terminal of the operational amplifier 244 will be determined by the voltage values of the test levels VHI, VTERM, and VLO, and will be somewhere between the highest and the lowest voltage value of the three test levels. In normal operation, no voltage in this range will be damaging to either the pin electronics circuit 110 or to the DUT through the connection at DUT pin 160. In this particular implementation, the CMOS switches 254, 255, 256 are National Semiconductor 74HC4066 CMOS switches, although other types of switches known to those of ordinary skill can be used.

As stated above, the test levels VHI, VTERM or VLO, or a combination of all three test levels, is applied to the positive input terminal of operational amplifier 244. In this implementation, the operational amplifier 244 is used to drive the DUT pin 160 to test levels VHI, TERM or VLO, or a combination of all three test levels. The output of the operational amplifier 244 may be connected to a non-linear network, which may include diodes 248, 249 and resistor 251. Such a non-linear network simplifies low current measurements of the DUT pin 160. A non-linear network excluding diodes 248, 249 also may be used. Such a non-linear network simplifies the process of calibrating the ATE.

The output of operational amplifier 244 may be connect to the anode of diode 248 and the cathode of diode 249, and to the positive input of comparator 245. The cathode of diode 248 is connected to the anode of diode 249, to one terminal of resistor 251, and to the negative input terminal of operational amplifier 244. The negative input terminal of operational amplifier 244 receives a voltage signal from the common connection 270 of diode 248, diode 249, and resistor 251. This architecture is often referred to as a feedback loop. The feedback loop of operational amplifier 244 drives the voltage at the common connection 270 of diode 248, diode 249, and resistor 251 to the voltage connected through the closed CMOS switch 254, 255, 256 (which most times is either test level VHI, VTERM or VLO).

The output of operational amplifier 244 will be sufficiently higher or lower than the common connection 270 voltage to cause current to flow through diode 248 or diode 249. A similar amount of current also will flow through resistor 251. The resulting voltage at the second terminal of resistor 251 is applied to the DUT pin 160. Although the second terminal of resistor 251 is coupled to one terminal of resistor 252, little or no current will flow through resistor 252—a function of resistor 252 typically is to isolate the positive input of comparator 246 from potentially damaging voltages that are applied to DUT pin 160. The input impedance of operational amplifier 244 is very high, hence the current flowing through resistor 251 is almost the same as the current flowing through either of the diodes 248, 249. In this particular implementation, operational amplifier 244 is a BurrBrown OP4132, although other types of operational amplifiers can be used to effect the same operation that is consistent with design parameters.

The positive input terminal of comparator 245 is coupled to the output of operational amplifier 244. The negative input terminal of comparator 245 is coupled to the level generating circuit 130, from which the reference level DREF is generated. The comparator 245 determines whether the voltage at the output of operational amplifier 244 is above or below the reference level DREF. The output of comparator 245 is coupled to the PMU sequencer 223 via line 132.

The operation of comparator 245 is as follows. If the voltage level of the input to comparator 245 is higher than the reference level DREF, then the output of comparator 245 is set to logic HIGH, and is viewed by the Digital Test Sequencer 221 as logic HIGH. The PMU Sequencer 223, however, will increase reference level DREF incrementally until the output of comparator 245 changes to logic LOW, which occurs when reference level DREF is incrementally larger (e.g., a millivolt) than the input to comparator 245. When this occurs, a flag is set by the PMU Sequencer 223 for the reference level DREF to be measured. If the voltage level of the input to comparator 245 is lower than the reference level DREF, then the output of comparator 245 is set to logic LOW, and is viewed by the Digital Test Sequencer 221 as logic LOW. The PMU Sequencer 223, however, will decrease reference level DREF incrementally until the output of comparator 245 changes to logic HIGH, which occurs when reference level DREF is incrementally smaller (e.g., a millivolt) than the input to comparator 245. When this occurs, a flag is set by the PMU Sequencer 223 for the reference level DREF to be measured. This is how the output voltage of the operational amplifier 244 is determined.

Test measurements are made by setting DC voltage levels on the test and reference levels VHI, VTERM, VLO, DREF, and CREF, using various settings of the level generating circuit 130 and CMOS switches 254, 255, 256, and then initiating operation on either the Digital Test Sequencer 221 or the PMU Sequencer 223. Setting the values of the various levels, such as VHI, VTERM, VLO, DREF, and CREF, may be accomplished by sending appropriate data from the PMU sequencer 223 via line 128 to the level generating circuit 130.

Figure 3:
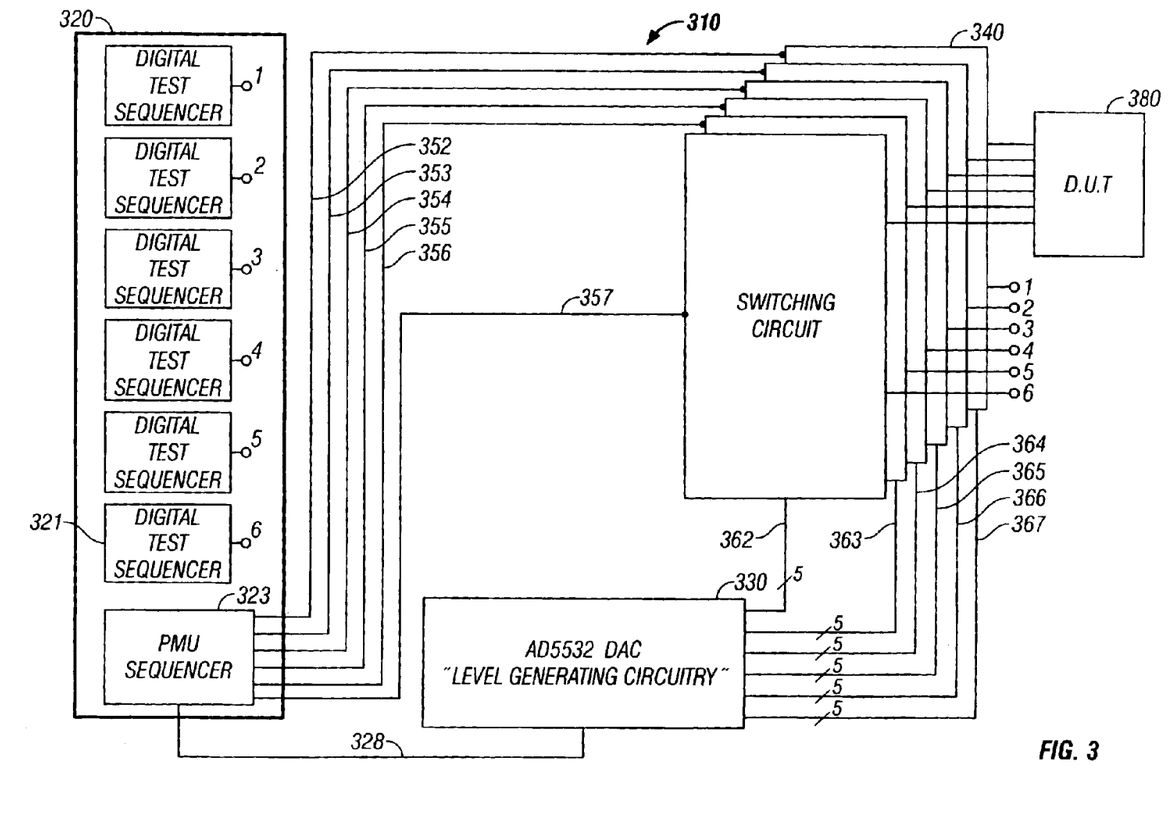
FIG. 3 is a diagram of a flexible and generalized pin electronics circuit architecture that can test and measure six DUT pins in parallel.

FIG. 3 shows a flexible and generalized pin electronics circuit architecture 310 that can test and measure six DUT pins 380 in parallel. In this particular implementation, the level generating circuit 330 supports up to six separate switching circuits 340, although the implementation could be modified to support a lesser or greater number of switching circuits. The reconfigurable logic device 320, which may be an FPGA, includes six separate Digital Test Sequencers 321 and one PMU sequencer 323. The number of PMU sequencers and the number of Digital Test Sequencers that can be fitted into a reconfigurable logic device, such as an FPGA, depends on the size of the FPGA and the number of pins that it has.

In this implementation, the level generating circuit 330 includes an Analog Devices AD5532 digital to analog converter (DAC). The AD5532 device is a 32-channel, voltage-output, 14-bit monotonic DAC. The AD5532 device contains 32 voltage-output DACs. The DACs may be selected one at a time over a five-wire address bus. The selected DAC can be programmed over a three-wire serial link with a stream of 14 consecutive bits that set the voltage level. The AD5532 device 330 may be connected to the six separate switching circuits 340 via lines 362, 363, 364, 365, 366, 367. The PMU sequencer 323 may be coupled to the AD5532 device 330 via line 328 and to each of the switching circuits 340 via lines 352, 353, 354, 355, 356, 357. By contrast, each Digital Test Sequencer 321 may be coupled to a corresponding switching circuit 340 via lines 1, 2, 3, 4, 5, 6.

While the Digital Test Sequencers 321 may be operated fully in parallel, in this implementation PMU measurements may be operated in parallel only for pins that are connected to different DACs. Therefore, six iterations are used to execute a PMU measurement on all pins. If the test program requires that a particular PMU measurement be made on all pins, then each PMU sequencer may be enabled to cycle sequentially through each of the six pins to which it is connected, recording the results from the measurement on each pin.

The details of algorithms that may be used to perform various tests and measurements using the various implementations described above are noted below.

Digital Tests—

This test typically includes a sequence of test vectors in which a DUT's input pins are driven to HIGH or LOW logic levels according to the contents of the test vector, and the DUT's output pins are measured to determine whether the output voltage is above or below a specified logic threshold level. This test is executed at a time appropriately defined for each vector in the sequence. Thus, this test requires setting the test and reference levels that are generated by the level generating circuit 130, 330 and applying an appropriate test vector to the switching circuit 140, 340, and consequently the DUT pin 160, 380. Digital tests are conducted at speeds low enough to allow the testing circuits to respond. The vector rate may be as low as 100 kilohertz. This is enough for many types of digital test.

The test and reference levels that are generated by the level generating circuit 130, 330 should be set as follows:

VHI—test level VHI should be set to a voltage that corresponds to the minimum HIGH logic input level (outputted from the Digital Test Sequencer 221, 321) plus the voltage drop to be expected by the current conducted through one of the diodes 248, 249 and the resistor 251 into DUT pin 160;

VLO—test level VLO should be set to a voltage that corresponds to the maximum LOW logic input level (outputted from the Digital Test Sequencer 221, 321) plus the voltage drop to be expected by the current conducted through one of the diodes 248, 249 and the resistor 251 into DUT pin 160;

VTERM—the test level VTERM should be set to a voltage corresponding to the required termination voltage;

CREF—the reference level CREF should be set to a voltage corresponding to the device output reference level; and DREF—the voltage setting of the reference level DREF does not matter for these type of tests.

The test vector typically has a specified time duration and a specified component for each DUT pin. The component can be represented by any of six characters 1, 0, H, L, X, or Z. The low-speed digital test operates in the following fashion:

1. At the beginning of the specified time duration, the positive input terminal of each operational amplifier (OpAmp) 241, 242, 243 should be set according to Table 1 a "--" means no change).

TABLE 1

| Char | OpAmp 241 | OpAmp 242 | OpAmp 243 |
|---|---|---|---|
| 1 | HIGH | LOW | LOW |
| 0 | LOW | LOW | HIGH |
| H | LOW | HIGH | LOW |
| L | LOW | HIGH | LOW |
| X | — | — | — |
| Z | LOW | HIGH | LOW |

2. At a time equal to 0.9 times the specified time duration, the output of comparator 246 should be checked, and a PASS or FAIL should be recorded according to Table 2.

TABLE 2

| Char | Comparator 246 | Record | Comparator 246 | Record |
|---|---|---|---|---|
| 1 | — | — | — | — |
| 0 | — | — | — | — |
| H | LOW | FAIL | HIGH | PASS |
| L | LOW | PASS | HIGH | FAIL |
| X | — | — | — | — |
| Z | — | — | — | — |

Thus, if the test vector has a specified component represented by a "H" and the output of comparator 246 measures at a LOW logic level, then a FAIL should be recorded, i.e., the DUT pin failed the test. Likewise, if the test vector has a specified component represented by a "H" and the output of the comparator 246 measures at a HIGH logic level, then a PASS should be recorded, i.e., the DUT pin passed the test.

The Digital Test Sequencer 221, 321 of the reconfigurable logic device 120, 320 executes this algorithm by reading each successive test vector from tables contained as a portion of the configuration or from memories connected to the reconfigurable logic device 120, 320 or from other vector storage means. Such storage means are familiar to those skilled in the art.

PMU Current Test (apply voltage and measure current)— A PMU current test typically includes applying a specified voltage to a DUT pin and measuring the resulting current. With respect to the disclosed pin electronics circuit 110, 310, applying the voltage to the DUT pin 160, 380 should be done as follows:

1. Connect test level VTERM, VHI or VLO to the positive input of operational amplifier 244;
2. Set the voltage of test level VTERM, VHI or VLO to the specified voltage;
3. Determine whether the voltage at DUT pin 160, 380 is above the specified voltage by sensing a HIGH logic level at the output of comparator 246;
4. If the voltage at DUT pin 160, 280 is above the specified voltage, adjust the voltage of test level VTERM, VHI or VLO downward until the change in voltage at the positive input terminal to comparator 246 causes the output of comparator 246 to go to a LOW logic level;
5. Else if the voltage at DUT pin 160, 280 is below the specified voltage, adjust the voltage of test level VTERM, VHI or VLO upward until the change in voltage at the positive input terminal to comparator 246 causes the output of comparator 246 to go to a HIGH logic level;

When the adjustment to the voltage of test level VTERM, VHI or VLO causes the output of comparator 246 to change (from HIGH to LOW logic level or LOW to HIGH logic level), then the voltage at the positive input terminal to comparator 246 is known to be close to the voltage of reference level CREF, which can now be adjusted to determine the resolution of the measurement.

Other voltage measurement algorithms, such as a binary search, may be used instead or in addition to those described here. With respect to a binary search, once the proper specified voltage is set, the current through the non-linear network, such as the current through diodes 248, 249 and resistor 251, which is being driven and applied to the DUT pin 160, 380, is measured by adjusting the voltage of reference level DREF upward or downward until the voltage at the positive input terminal to comparator 245 is determined with adequate resolution. Any of several different search algorithms, readily known to those of ordinary skill, can be used in this regard.

The difference between the voltage found on DUT pin 160, 380 and the output of operational amplifier 244 can be used to calculate the current because the I-V characteristics of diodes 248, 249 and resistor 251 can be known with sufficient accuracy.

PMU Voltage Test (apply current and measure voltage)— this test typically includes applying a specified current to a DUT pin and measuring the resulting voltage. Because the current into DUT pin 160, 380 can be determined by measuring the voltages at both the DUT pin 160, 380 and the output of operational amplifier 244, the process of applying the current and measuring the voltage is transformed into setting the voltage of test level VTERM, VHI or VLO to a preliminary value, just as in the PMU Current Test, and then measuring the current, followed by adjusting the voltage of test level VTERM, VHI or VLO upward or downward depending on whether the measured current is below or above the required set point. Limiting values of voltage and current are included in the algorithms of the PMU Sequencer 223, 323 to prevent damage either to the DUT or to the circuitry.

Leakage Tests—this test is a special case of applying a specified voltage to the DUT pin 160, 380 and measuring the resulting current. If the measured current is too high, the leakage test fails. In general, a leakage test can be simplified because the exact current value does not need to be known. Because the current leakage in modern circuits is expected to be very small, the measured voltage drop typically would not provide adequate resolution without diodes 248, 249, which have nearly logarithmic voltage-current characteristics at very low currents. The additional voltage drop across resistor 251 typically is very small in standard leakage tests.

Continuity Test—this test determines whether a connection exists between the pin electronics circuit and the DUT output pin. This test is a special case of applying a specified voltage and measuring current at the DUT output pin, but without power being supplied to the DUT. If the measured current is too low, then the continuity test fails. This test also can be simplified because the exact current value does not need to be known.

VOH Test—this test measures the HIGH logic level output voltage when a specified current is applied to a DUT output pin. This test is a special case of applying a specified current to a DUT output pin and measuring the resulting voltage at the DUT output pin. The DUT output pin is operated under control of the Digital Test Sequencer 221, 321 until the DUT output pin is expected to be driven to a HIGH logic level. Then the current is set to the maximum HIGH output current according to the DUT specification and the voltage at the DUT output pin is measured.

VOL Tests—this test measures the LOW logic level output voltage when a specified current is applied to a DUT output pin. Generally, this test is a special case of applying a current to a DUT output pin and measuring the resulting voltage at the DUT output pin. The DUT output pin is operated under control of the Digital Test Sequencer 221, 321 until the DUT output pin is expected to be driven to a LOW logic level. Then the current is set to the maximum LOW output current according to the DUT specification and the voltage at the DUT output pin is measured.

IIH Test—this test measures the current required to drive a DUT input pin to a specified HIGH logic level. This test is a special case of applying a specified voltage (e.g., the minimum HIGH logic level) to a DUT input pin and measuring the required current at the DUT input pin.

IIL Test—this test measures the current required to drive a DUT input pin to a specified LOW logic level. This test is a special case of applying a specified voltage (e.g., maximum LOW logic level) to a DUT input pin and measuring the required current at the DUT input pin and measuring current.

Various implementations of the pin electronics circuits, architecture and testing techniques described here may be realized in digital electronic circuitry, integrated circuitry, specially designed ASICs (application specific integrated circuits), Field Programmable Gate Arrays (FPGAs), or in computer hardware, firmware, software, or combinations thereof.

The computational aspects described here can be implemented in digital electronic circuitry, or in computer hardware, firmware, software, or in combinations of them. Where appropriate, aspects of these systems and techniques can be implemented in a computer program product tangibly embodied in a machine-readable storage device for execution by a programmable processor; and method steps can be performed by a programmable processor executing a program of instructions to perform functions by operating on input data and generating output.

To provide for interaction with a user, a computer system can be used having a display device such as a monitor or LCD screen for displaying information to the user and a keyboard and a pointing device such as a mouse or a trackball by which the user can provide input to the computer system. The computer system can be programmed to provide a graphical user interface through which computer programs interact with users.

A number of implementations have been described. Nevertheless, it will be understood that various modifications may be made without departing from the spirit and scope of the claims. Accordingly, other embodiments are within the scope of the following claims.

What is claimed is:

1. A pin electronics circuit-implemented method for use in automatic test equipment, the method comprising:
   generating a plurality of test signals and reference signals;
   applying each generated test signal to a corresponding one of a plurality of switches;
   driving the switches to select an applied test signal based on a plurality of test vector signals;
   applying the selected test signal to a device under test;
   comparing one or more of the generated reference signals to the selected test signal or an output signal from the device under test; and
   making measurements with a reconfigurable logic device according to tests applied to the device under test.

2. The circuit implemented method of claim 1, wherein the reconfigurable logic device comprises a field programmable gate array.

3. The circuit implemented method of claim 1, wherein the reconfigurable logic device comprises a digital test sequencer and a parametric measurement unit.

4. A pin electronics circuit implemented-method for use in automatic test equipment, the method comprising:
   generating a plurality of test levels and a plurality of reference levels with a level generating circuit coupled to a reconfigurable logic device;
   receiving the plurality of test levels and the plurality of reference levels with a switching circuit;
   controlling the switching circuit with the reconfigurable logic device to selectively apply the plurality of test levels to the device under test according to a plurality of test; and
   making measurements according to plurality of tests with the reconfigurable logic deice and level generating circuit.

5. The pin electronics circuit of claim 4, wherein the reconfigurable logic device comprises:
   a digital test sequencer comprising a plurality of outputs, each output configured to output a test vector, and a plurality of inputs, each configured to receive a compare signal corresponding to an output from one of a plurality of comparators.

6. The pin electronics circuit implemented method of claim 5, wherein the reconfigurable logic device further comprises:
   a parametric measurement unit coupled to the level generating circuit and capable of setting the plurality of levels and the plurality of reference levels according to the plurality of tests.

7. The pin electronics circuit implemented method of claim 4, wherein the level generating circuit comprises a plurality of digital-to-analog converters.

8. A pin electronics circuit implemented method for claim 4 wherein receiving the plurality of test levels and the plurality of reference levels with a switching circuit comprising:
   receiving the test levels, each test level received by a corresponding one of a plurality of switches;

receiving the reference levels, each reference level received by a corresponding one of a plurality comparators, each comparator configured to compare the received reference signal to the selected test signal or an output signal from the device under test.

9. The pin electronics circuit implemented method of claim of claim 8 wherein each one of the plurality of switches is a complementary metal oxide semiconducting switch.

10. The pin electronics circuit implemented method of claim 4, wherein controlling the switching circuit with the reconfigurable logic device to selectively apply the plurality of test levels to the device under test according to the plurality of tests comprises:

outputting a plurality of test vectors, each test vector outputted from a digital test sequencer to a corresponding one of the operational amplifiers;

driving the plurality of switches to relay the test level to a buffer in accordance with the plurality of test vectors; and applying the relayed test level to the device under test with the buffer.

11. The pin electronics circuit implemented method of claim 10, wherein a non-linear network is configured to be coupled between the buffer and the device under test.

12. The method of configuring a pin electronics circuit to implement a selected test from a plurality of test, said method comprising:

selecting a test from a plurality of tests to be applied to a device under test;

setting values for a plurality of tests levels and a plurality of reference levels with a parametric measurement unit sequencer according to the selected test;

generating the test levels and reference levels at the set values with a level generating circuit; and applying selectively the generated test levels to the device under test through a switching circuit controlled by a reconfigurable logic device.

13. The method of claim 12 further comprises sensing the test levels applied to the device under test or output levels outputted from the device under test with one or more comparators and the generated reference levels in response to the selected test from the plurality of test.

14. The method of claim 13 further comprises measuring the sensed test levels or output levels in response to the selected test from the plurality of tests.

15. The method of claim 14 further comprises outputting a signal corresponding to measurements of the sensed test levels or output levels to a display device.

16. The method of claim 12 wherein the test from a plurality may be a parametric measurement unit current test, a parametric measurement unit voltage test, a leakage test, a continuity test, a VOH test, a VOL test, a IIH test, or a IIL test.

17. The method of claim 12 wherein applying selectively the generated test levels to the device under test through a switching circuit controlled by a reconfigurable logic device comprises:

receiving the generated test levels, each generated test level received by a corresponding one of a plurality of switches according to the selected test of the plurality of tests;

outputting a plurality of test vectors, each test vector outputted from a digital test sequencer to a corresponding one of a plurality of operational amplifiers, according to the selected test of the plurality of tests;

driving the plurality of switches to relay the received test level to a buffer in response to the plurality of test vectors; and applying the relayed test level to the device under test with the buffer.

* * * * *